United States Patent [19]
Mashiko et al.

[11] Patent Number: 4,833,653
[45] Date of Patent: May 23, 1989

[54] DYNAMIC RANDOM ACCESS MEMORY HAVING SELECTIVELY ACTIVATED SUBARRAYS

[75] Inventors: Koichiro Mashiko; Kazutami Arimoto; Kiyohiro Furutani; Noriaki Matsumoto; Yoshio Matsuda, all of Hyogo, Japan

[73] Assignee: Mitsubishi Denki Kabushiki Kaisha, Tokyo, Japan

[21] Appl. No.: 94,642

[22] Filed: Sep. 9, 1987

[30] Foreign Application Priority Data

Sep. 9, 1986 [JP] Japan ................................. 61-213113

[51] Int. Cl.4 .............................................. G11C 7/00
[52] U.S. Cl. .................................... 365/203; 365/189; 365/238.5
[58] Field of Search ............... 365/189, 203, 205, 210, 365/230, 233, 149

[56] References Cited

U.S. PATENT DOCUMENTS 4,551,820  11/1985  Matsuura ........................... 365/189

OTHER PUBLICATIONS

*IEEE Journal*, "The Design and Performance of CMOS 256K Bit DRAM Devices", by A. M. R. Mohsen et al., pp. 610–618, V. SC-19, No. 5, Oct. 1984.
*ISSCC* 86, "An Experimental 4Mb CMOS DRAM", by Tohru Furuyama et al., pp. 272–273, Feb. 21, 1986.
Nikkei Microdevices: "DRAM Skills Having 4M Bits", by T. Furuyama et al., 3/1986, pp. 97–108.

*Primary Examiner*—Joseph A. Popek
*Attorney, Agent, or Firm*—Lowe, Price, LeBlanc, Becker & Shur

[57] ABSTRACT

A DRAM of a partially activating system, in which, in an active cycle, sense amplifiers (91a, 91b) are inactivated and the potential on each pair of bit lines (BLA1, $\overline{BLA1}$, BLA2, $\overline{BLA2}$) is equalized early in the active cycle only for a subarray to be accessed while the potential is not equalized and the sense amplifiers are kept to be activated for a subarray not to be accessed. At the time of an inactive cycle, all the sense amplifiers (91a, 91b) are activated, and the bit lines (BLA1, $\overline{BLA1}$, BLA2, $\overline{BLA2}$) in the memory cell array are at an "H" or "L" level depending on information read out in the previous active cycle.

15 Claims, 6 Drawing Sheets

DYNAMIC RANDOM ACCESS MEMORY HAVING SELECTIVELY ACTIVATED SUBARRAYS

BACKGROUND OF THE INVENTION

1. Field of the Invention

The present invention relates to a dynamic random access memory and more particularly, to an improvement of a partial activating system in which a memory cell array is divided into a plurality of subarrays and only a subarray having a word line to be selected or a memory cell to be selected is activated.

2. Description of the Prior Art

As capacity of a dynamic random access memory (referred to as a DRAM hereinafter) has been increasing, charging and discharging current in a memory cell array has been increasing. Thus, the rate of the charging and discharging current in the memory cell array in a total consumed current of the DRAM increases, which causes a difficulty in reducing consumed power of the DRAM. In order to reduce the charging and discharging current, various systems for partially activating the memory cell array have been proposed.

Figure 1:
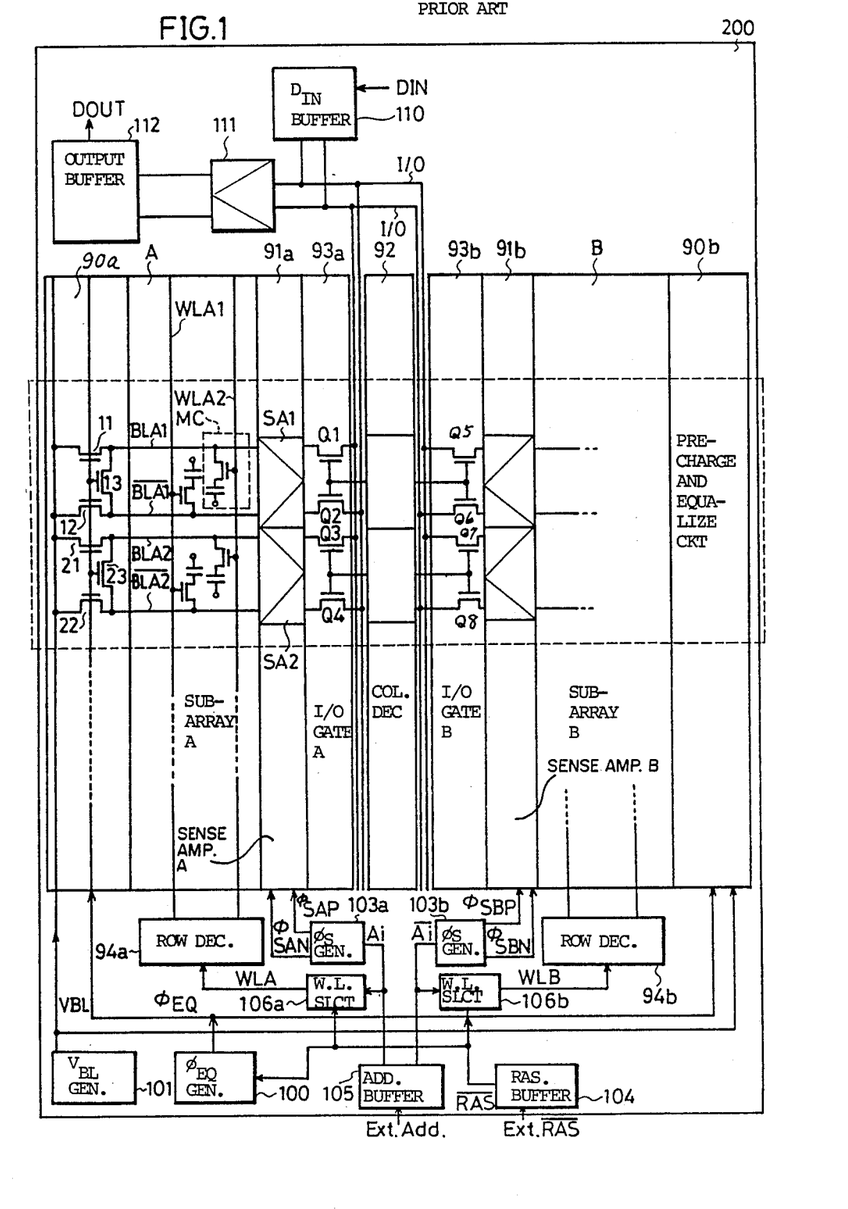
FIG. 1 is a diagram showing a schematic entire structure of a conventional DRAM.

FIG. 1 is a diagram showing schematically an entire structure of a conventional DRAM of a partial activating system of a memory cell array, which is disclosed in, for example, "Nikkei Microdevice", March, 1986, pp. 97–108.

Referring now to FIG. 1, a memory cell array is divided into two subarrays A and B. The subarrays A and B have the same structure each comprising a plurality of memory cells MC arranged in a matrix of rows and columns, a plurality of word lines for selecting a single row from a plurality of memory cells, and a plurality of bit lines for selecting a single column from a plurality of memory cells. For simplicity, two word lines WLA1 and WLA2, four bit lines BLA1, $\overline{BLA1}$, BLA2 and $\overline{BLA2}$ and four memory cells provided at intersections of the word lines and the bit lines in the subarray A are illustrated in FIG. 1. The bit lines BLA1 and $\overline{BLA1}$ are paired, and the bit lines BLA2 and $\overline{BLA2}$ are paired.

The subarray A is connected to a precharge and equalize block 90a for precharging each bit line to voltage $V_{BL}$, a group 91a of sense amplifiers for detecting and amplifying the potential difference between each pair of bit lines, a column gate block 93a responsive to an output of a column decoder 92 for connecting a pair of bit lines to data input/output buses I/O, $\overline{I/O}$, and a row decoder 94a responsive to a row address signal for selecting a single word line.

The precharge and equalize block 90a is responsive to an equalizing signal $\phi_{EQ}$ from an equalizing signal generator 100 for transmitting the voltage $V_{BL}$ from a $V_{BL}$ generator 101 to each bit line and electrically connecting to each other bit lines of each pair of bit lines, so that the potential on bit lines of each pair of bit lines is equalized.

The group 91a of sense amplifiers comprises sense amplifiers SA1, SA2, ... each provided corresponding to each pair of bit lines. Each of the sense amplifiers is activated in response to sense amplifier activating signals $\phi_{SAP}$ and $\phi_{SAN}$ from a sense amplifier activating signal generator 103a, so as to detect and amplify the potential difference between each pair of bit lines connected thereto.

The column gate block 93a comprises transfer gates Q1, Q2, Q3, Q4, ... each provided corresponding to each bit line. A pair of transfer gates are turned on in response to a decoded column address signal from the column decoder 92, so that a pair of bit lines is selected and connected to the data input/output buses I/O and $\overline{I/O}$.

The row decoder 94a decodes an internal address signal from an address buffer 105 for selecting a single word line, so that a word line drive signal WLA is transmitted from a word line select driver 106a to the selected word line.

In the same manner, there are provided in association with the subarray B a precharge and equalize block 90b which is enabled in response to the equalizing signal $\phi_{EQ}$ for precharging and equalizing bit lines of each pair of bit lines to the voltage $V_{BL}$, a group 91b of sense amplifiers which is activated in response to sense amplifier activating signals $\phi_{SBP}$ and $\phi_{SBN}$ from a sense amplifier activating signal generator 103b for detecting and amplifying the potential difference between each pair of bit lines, a column gate block 93b responsive to an output of the column decoder 92 for connecting a pair of bit lines to the data input/output buses I/O and $\overline{I/O}$, and a row decoder 94b responsive to an internal address signal for selecting a single word line and transmitting a word line drive signal WLB applied from a word line select driver 106b to the selected word line.

Periphery circuitry comprises a RAS buffer 104 responsive to an external row address strobe signal Ext. $\overline{RAS}$ for generating an internal row address strobe signal $\overline{RAS}$ serving as a basic clock of memory operation, an address buffer 105 responsive to the external address signal Ext. $\overline{RAS}$ for generating a complementary internal address signal, a word line select driver 106a responsive to a block select address Ai included in the internal address signal from the address buffer 105 and the signal $\overline{RAS}$ from the RAS buffer 104 for generating the word line drive signal WLA, a sense amplifier activating signal generator 103a responsive to the block select address Ai from the address buffer 105 for generating the sense amplifier activating signals $\phi_{SAP}$ and $\phi_{SAN}$, a word line select driver 106b responsive to a block select address $\overline{Ai}$ from the address buffer 105 and the signal $\overline{RAS}$ from the RAS buffer 104 for generating the word line drive signal WLB, a sense amplifier activating signal generator 103b responsive to a block select address $\overline{Ai}$ from the address buffer 105 for generating the sense amplifier activating signals $\phi_{SBN}$ and $\phi_{SBP}$, an equalizing signal generator responsive to the signal $\overline{RAS}$ from the RAS buffer 104 for generating the equalizing signal $\phi_{EQ}$, and a $V_{BL}$ generator 101 for generating the precharging voltage $V_{BL}$.

In order to input and output data, there are provided a data input buffer 110 for transmitting input data $D_{IN}$ externally applied to the data input/output buses I/O and $\overline{I/O}$, a preamplifier 111 for amplifying data on the data input/output buses I/O and $\overline{I/O}$, and a data output buffer 112 for transmitting data applied from the preamplifier 111 to the exterior.

The above described circuit is integrated on a semiconductor chip 200. For simplicity of illustration, a path of address signals transmitted to the row decoders 94a and 94b and the column decoder 92 from the address buffer 105 is not illustrated in FIG. 1.

Figure 2:
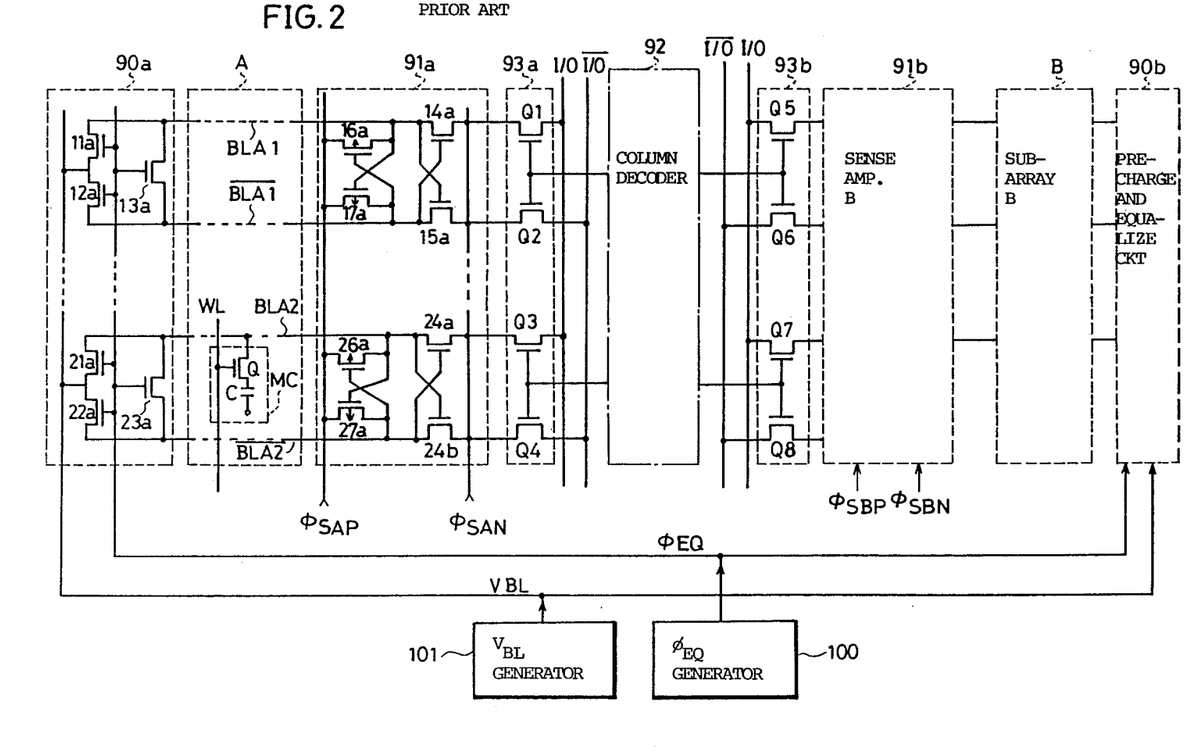
FIG. 2 is a diagram showing in more detail a structure of a bit line portion of a conventional DRAM of a partial activating system.

FIG. 2 is a diagram showing in more detail a structure of a bit line portion of the DRAM shown in FIG. 1, which corresponds to a block enclosed by broken lines shown in FIG. 1. Although a structure of the subarray A is specifically illustrated in FIG. 2, a structure of the subarray B is the same as that of the subarray A. Referring now to FIG. 2, a structure of the bit line portion is described.

The precharge and equalize block 90a comprises n channel MOS transistors 11a, 12a and 13a provided for the pair of bit lines BLA1 and $\overline{BLA1}$ and n channel MOS transistors 21a, 22a and 23a provided for the pair of bit lines BLA2 and $\overline{BLA2}$.

The MOS transistors 11a and 12a are turned on in response to the equalizing signal $\phi_{EQ}$ to transmit the voltage $V_{BL}$ applied from the $V_{BL}$ generator 101 to the bit lines BLA1 and $\overline{BLA1}$, respectively. The MOS transistor 13a is turned on in response to the equalizing signal $\phi_{EQ}$ to electrically connect the paired bit lines BLA1 and $\overline{BLA1}$ to each other and equalize the potentials on the bit lines BLA1 and $\overline{BLA1}$.

The MOS transistors 21a and 22a are turned on in response to the equalizing signal $\phi_{EQ}$ to transmit the voltage $V_{BL}$ to the bit lines BLA2 and $\overline{BLA2}$, respectively. The MOS transistor 23a is turned on in response to the equalizing signal $\phi_{EQ}$ to electrically connect the bit lines BLA2 and $\overline{BLA2}$ to each other and equalize the potentials on the bit lines BLA2 and $\overline{BLA2}$.

The group 91a of sense amplifiers comprises n channel MOS transistors 14a and 15a and p channel MOS transistors 16a and 17a provided for the paired bit lines BLA1 and $\overline{BLA1}$, and n channel MOS transistors 24a and 24b and p channel MOS transistors 26a and 27a provided for the paired bit lines BLA2 and $\overline{BLA2}$.

The cross-coupled MOS transistors 14a and 15a are activated in response to the sense amplifier activating signal $\phi_{SAN}$ to decrease the potential on a bit line with lower potential of the paired bit lines BLA1 and $\overline{BLA1}$ to a ground potential level. The cross-coupled MOS transistors 16a and 17a are activated in response to the sense amplifier activating signal $\phi_{SAP}$ to increase the potential on a bit line with higher potential of the paired bit lines BLA1 and $\overline{BLA1}$ to a power-supply potential level.

In the same manner, the cross-coupled MOS transistors 24a and 24b are activated in response to the sense amplifier activating signal $\phi_{SAN}$ to decrease the potential on a bit line with lower potential of the paired bit lines BLA2 and $\overline{BLA2}$ to the ground potential level. The cross-coupled MOS transistors 26a and 27a are activated in response to the sense amplifier activating signal $\phi_{SAP}$ to increase the potential on a bit line with higher potential of the paired bit lines BLA2 and $\overline{BLA2}$ to the power supply potential level.

The column gate block 93a comprises transfer gates Q1, Q2, Q3 and Q4. The transfer gates Q1 and Q2 are turned on in response to the output of the column decoder 92 to connect the bit lines BLA1 and $\overline{BLA1}$ to the data input/output buses I/O and $\overline{I/O}$, respectively. The transfer gates Q3 and Q4 are turned on in response to the output of the column decoder 92 to connect the bit lines BLA2 and $\overline{BLA2}$ to the data input/output buses I/O and $\overline{I/O}$, respectively. As a result, a pair of bit lines is selected by the output of the column decoder 92 and connected to the data input/output buses I/O and $\overline{I/O}$.

The subarray A has a plurality of memory cells arranged in a matrix. In FIG. 2, only a memory cell MC connected to a word line WL and a bit line BLA2 is illustrated. Since the bit line has a folded bit line structure, only a single memory cell is provided at one of intersections of a pair of bit lines and a single word line. The memory cell MC comprises a capacitor C for storing information in the form of charges, and a transfer gate Q responsive to the potential on the word line for connecting the capacitor C to the bit line.

The subarray B has the same structure as that of the subarray A. In FIG. 2, only transfer gates Q5, Q6, Q7 and Q8 in a column gate block 93b are specifically illustrated.

Figure 3:
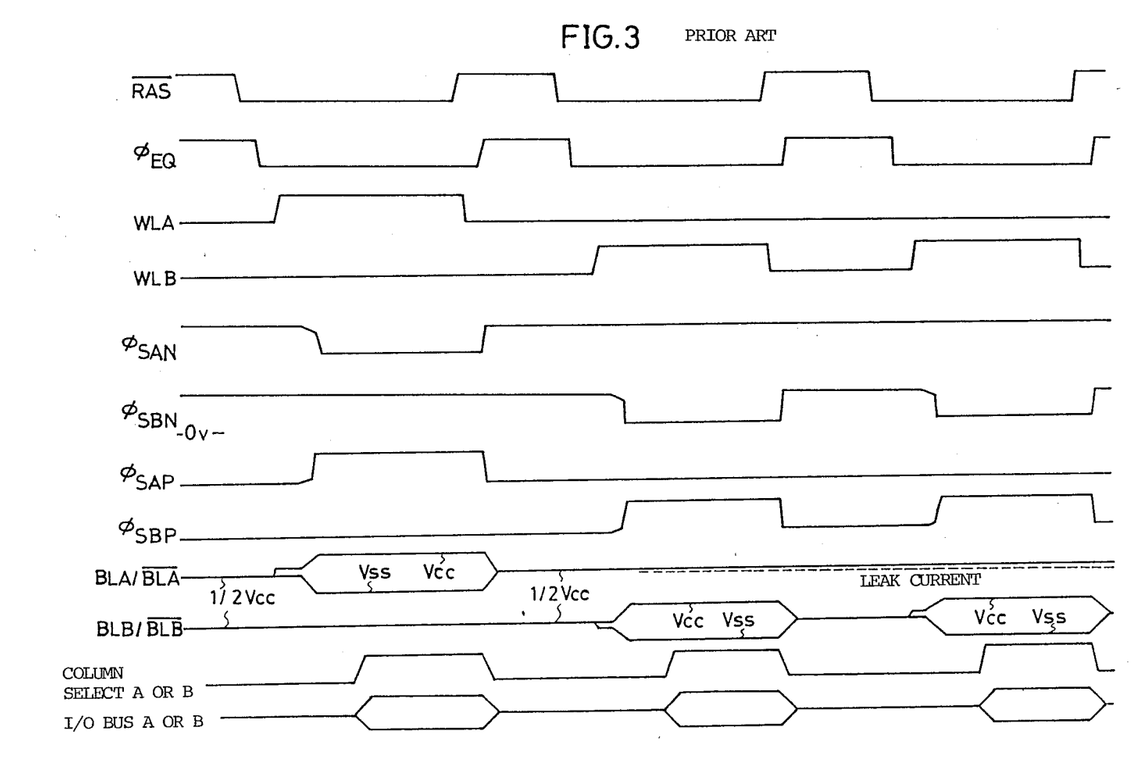
FIG. 3 is a waveform diagram showing operation at the time of sensing of the conventional DRAM of a partial activating system.

FIG. 3 is a waveform diagram showing operation at the time of sensing operation of the DRAM shown in FIGS. 1 and 2. Referring now to FIGS. 1 to 3, operation of the conventional DRAM is described.

When the external clock signal Ext. $\overline{RAS}$ falls, an active operation cycle of the DRAM is started. When the external clock signal Ext. $\overline{RAS}$ falls, the internal signal $\overline{RAS}$ from the RAS buffer 104 also falls. The equalizing signal $\phi_{EQ}$ from the equalizing signal generator 100 falls in response to the fall of the internal signal $\overline{RAS}$, so that the equalizing transistors 13A, 13B, 23A and 23B and the transfer transistors 11A, 11B, 12A, 12B, 21A, 21B, 22A and 22B are turned off. As a result, precharging of each bit line is completed and bit lines in each pair of bit lines are electrically disconnected. Precharging and equalizing are completed in both the blocks at the same time.

The address buffer 105 latches an external address signal Ext. Add in response to the fall of the signal $\overline{RAS}$ and transmits the same to the row decoders 94a and 94b. The word line select driver 106a is then activated by the block select address $\overline{Ai}$ applied from the address buffer 105, so that the word line drive signal WLA is generated in response to the fall of the signal $\overline{RAS}$. At that time, since the word line select driver 106b is not activated by the block select address $\overline{Ai}$, the word line drive signal WLB remains at an "L" level. The row decoder 94a selects a single word line WL by a row address signal and transmits the word line drive signal WLA to the selected word line WL. Therefore, the potential on the selected word line WL rises, so that information stored in the memory cell MC is transmitted to the bit line BLA (or $\overline{BLA}$). As a result, the potential difference corresponding to information stored in the memory cell MC appears between the bit lines BLA and $\overline{BLA}$. The sense amplifier activating signal generator 103a is then activated by the block select address Ai, so that the sense amplifier activating signal $\phi_{SAP}$ rises and the sense amplifier activating signal $\phi_{SAN}$ falls, whereby each sense amplifier in the group 93a of sense amplifiers is activated. As a result, the potential difference between each pair of bit lines is amplified, so that the potential on each bit line attains a power supply potential Vcc level or a ground potential Vss level. At that time, since the sense amplifier activating signal generator 103 in the subarray B is not activated by the block select address $\overline{Ai}$, sensing operation is not performed in the subarray B. The column decoder 92 selects a pair of bit lines by a column address signal applied from the address buffer 105. Then, a transfer gate connected to the selected pair of bit lines is turned on, so that the potential on the selected pair of bit lines is transmitted to the input/output buses I/O and $\overline{I/O}$. Data transmitted to the data input/output buses I/O and $\overline{I/O}$ are sent as output data $D_{OUT}$ to the exterior through the preamplifier 111 and the output buffer 112. The external clock signal Ext. $\overline{RAS}$ then rises. Accordingly, the internal clock signal $\overline{RAS}$ rises so that one operation cycle is completed, the potential on the selected word line falls. Therefore, after operation for restoring the amplified signal voltage on each pair of bit lines to the original memory cells is completed, the equalizing signal $\phi_{EQ}$ rises to the "H" level, so that precharging and equalizing operation is performed again. As a result, the potential on each bit line is charged to be the potential $V_{BL}$ ($=\frac{1}{2}$ Vcc). At that time, since a pair of bit lines in the accessed subarray is equalized to an intermediate potential level between the "H" ($=$Vcc) level and the "L" ($=$Vss) level, the voltage $V_{BL}$ of an output of the $V_{BL}$ generator 101 must be also set to the same intermediate potential level ($\frac{1}{2}$) Vcc.

In the DRAM of the above described partial activating system, when only one of the subarrays is continuously accessed, the potential on a pair of bit lines included in a subarray which is not accessed is decreased by a leak current produced on each bit line. In order to compensate for decrease in equalizing/precharging potential on the pair of bit lines, a $V_{BL}$ generator for generating the bit line charging voltage $V_{BL}$ is required. However, even if such a $V_{BL}$ generator is provided, the precharging/equalizing potential on each pair of bit lines included in a subarray which is not accessed is decreased by the leak current if only one of the subarrays is continuously accessed (see FIG. 3).

Furthermore, a power supply of the DRAM is used as a power supply of the $V_{BL}$ generator. Thus, if dependency of the $V_{BL}$ generator on the supply voltage is not optimized, the charging voltage $V_{BL}$ is affected by variation of the power-supply voltage Vcc, so that the precharging potential on the bit line deviates from the optimum value of sensing operation. As a result, operating margin of the sense amplifier is decreased, so that information can not be precisely read out.

Additionally, the charging voltage $V_{BL}$ is set to half of the power-supply voltage Vcc. However, it is difficult to achieve a circuit for precisely generating the voltage of $\frac{1}{2}$·Vcc.

A DRAM comprising a plurality of divided blocks of a memory array and activating a quarter of the divided blocks during each of RAS operation cycles is disclosed by T. Furuyama et al., entitled "An Experimental 4Mb CMOS DRAM", IEEE, International Solid-State Circuits Conference Digest of Technical Papers, 1986, pp. 272-273. Although the DRAM of the prior art partially activates a memory array, the voltage $V_{BL}$ is used for precharging/equalizing each pair of bit lines, so that a $V_{BL}$ generator is required.

A system for precharging/equalizing each pair of bit lines without using the $V_{BL}$ generator is disclosed by A. Mohsen et al., entitled "The Design and Performance of CMOS 25K Bit DRAM Device", IEEE Journal of Solid-State Circuits, Vol. SC-19, No. 5, Oct. 1984, pp. 610-618. The prior art describes a DRAM of a system of holding each bit line at the power-supply potential Vcc level or the ground potential Vss level in a normal precharging cycle and equalizing each pair of bit lines early in an active cycle. The DRAM of the prior art holds actively bit lines at the power-supply potential Vcc level or the ground potential Vss level and equalizes each pair of bit lines early in an active cycle. Therefore, a circuit structure is complicated.

SUMMARY OF THE INVENTION

A primary object of the present invention is to remove disadvantages of a conventional DRAM of a partial activating system and to provide a DRAM of a partial activating system in which precharging/equalizing potential on a bit line is not decreased in a simple circuit structure without using a $V_{BL}$ generator.

The DRAM according to the present invention is adapted such that a pair of bit lines included in a subarray having a word line (or a memory cell) to be selected is equalized and a sense amplifier connected to the pair of bit lines included in the subarray is rendered inactive after a clock signal $\overline{RAS}$ falls, and the inactivated sense amplifier is rendered active after the potential on the selected word line rises, while a sense amplifier included in a subarray having no word line to be selected remains activated irrespective of an operation cycle.

In the system of partially activating the memory cell array in the DRAM according to the present invention, all sense amplifiers are rendered active before the clock signal $\overline{RAS}$ falls, so that the potential on a bit line is held at an "H" or "L" potential level in the previous cycle, and only pairs of bit lines in a subarray having a selected word line is equalized through sense amplifiers and equalizing transistors before the rise of the potential on the word line after the clock signal $\overline{RAS}$ falls, so that the potential on the bit lines is precisely set to an intermediate level between the "H" and "L" levels and a $V_{BL}$ generator for charging the bit line to the precharging/equalizing potential is not required.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
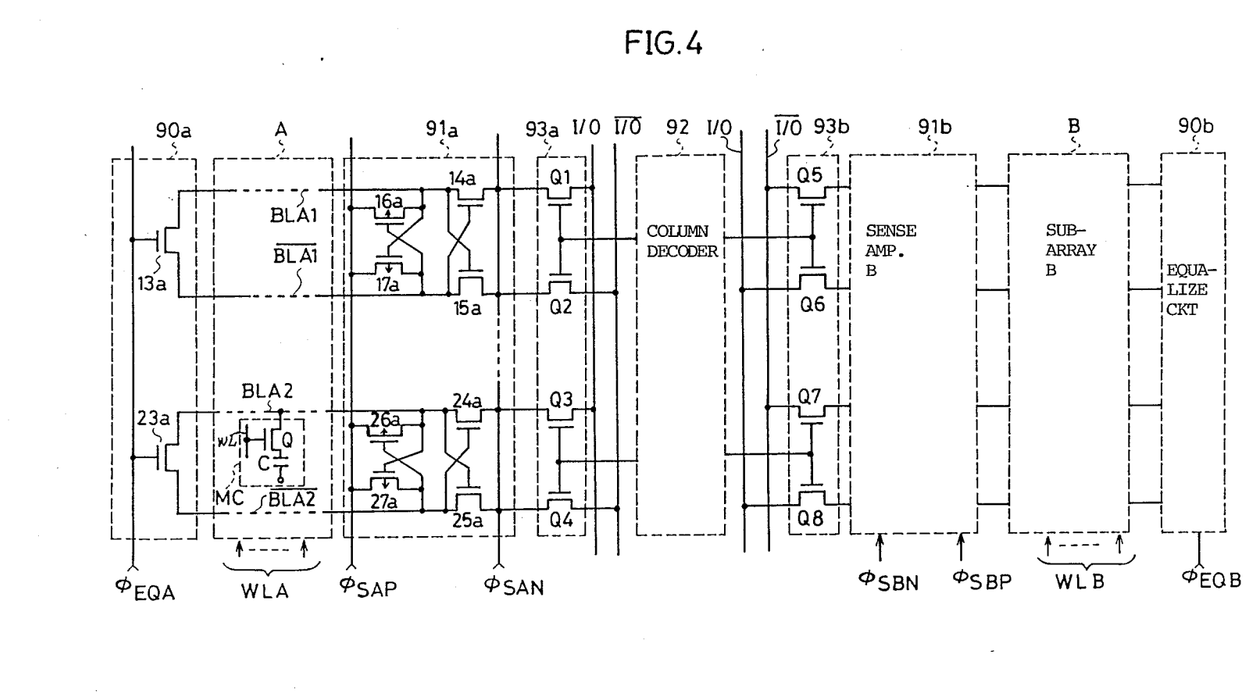
FIG. 4 is a diagram showing a structure of a main portion of a DRAM of a partial activating system according to an embodiment of the present invention.

FIG. 4 is a diagram showing a structure of a main portion of a DRAM of a partial activating system according to an embodiment of the present invention, which corresponds to a structure of the conventional DRAM of a partial activating system shown in FIG. 2.

Referring now to FIG. 4, a memory array is divided into subarrays A and B. Each of the subarrays A and B has a plurality of word lines, a plurality of bit lines, and a plurality of memory cells arranged in a matrix of rows and columns. For simplicity of illustration, only two pairs of bit lines (i.e. four bit lines) BLA1, $\overline{BLA1}$, BLA2 and $\overline{BLA2}$ and a memory cell MC connected to a word line WL and the bit line BLA2 are illustrated in FIG. 4.

There are provided in association with the subarray A an equalize block 90a which is activated in response to an equalizing signal $\phi_{EQA}$ for equalizing the potential on each pair of bit lines, a group 91a of sense amplifiers which is activated in response to sense amplifier activating signals $\phi_{SAP}$ and $\phi_{SAN}$ for detecting and amplifying the potential difference between each pair of bit lines, and a column select gate block 93a responsive to an output of a column decoder 92 for connecting a pair of bit lines to data input/output buses I/O and $\overline{\text{I/O}}$.

The equalize block 90a comprises n channel MOS transistors 13a, 23a, . . . each provided corresponding to each pair of bit lines. The MOS transistors 13a, 23a, . . . , are turned on in response to the equalizing signal $\phi_{EQA}$ for electrically connecting to each other the bit lines BLA1 and $\overline{\text{BLA1}}$ and BLA2 and $\overline{\text{BLA2}}$ of each pair of bit lines and equalizing the potential on each pair of bit lines. The group 91a of sense amplifiers comprises a p-MOS sense amplifier and an n-MOS sense amplifier each provided corresponding to each pair of bit lines.

Sense amplifiers corresponding to the pair of bit lines BLA1 and $\overline{\text{BLA1}}$ comprises a p-MOS sense amplifier comprising cross-coupled p channel MOS transistors 16a and 17a for increasing the potential on a bit line with higher potential of the pair of bit lines BLA1 and $\overline{\text{BLA1}}$ to a power-supply potential Vcc level in response to the sense amplifier activating signal $\phi_{SAP}$, and an n-MOS sense amplifier comprising cross-coupled n channel MOS transistors 14a and 15a, which is activated in response to the sense amplifier activating signal $\phi_{SAN}$, for decreasing the potential on a bit line with lower potential of the pair of bit lines BLA1 and $\overline{\text{BLA1}}$ to a ground potential Vss level.

The sense amplifier corresponding to the pair of bit lines BLA2 and $\overline{\text{BLA2}}$ comprises a p-MOS sense amplifier comprising cross-coupled p channel MOS transistors 26a and 27a, which is activated in response to the sense amplifier activating signal $\phi_{SAP}$, for increasing the potential on a bit line with higher potential of the pair of bit lines BLA2 and $\overline{\text{BLA2}}$ to the power-supply potential Vcc level, and an n-MOS sense amplifier comprising cross-coupled n channel MOS transistors 24a and 25a, which is activated in response to the sense amplifier activating signal $\phi_{SAN}$, for decreasing the potential on a bit line with lower potential to the ground potential Vss level.

The column selecting gate block 93a comprises transfer gates Q1, Q2, Q3 and Q4 provided for the bit lines BLA1, $\overline{\text{BLA1}}$, BLA2 and $\overline{\text{BLA2}}$, respectively. The transfer gates Q1 and Q2 are turned on in response to the output (decoded column address signal) of the column decoder 92 for connecting the bit lines BLA1 and $\overline{\text{BLA1}}$ to the data input/output buses I/O and $\overline{\text{I/O}}$, respectively. The transfer gates Q3 and Q4 are turned on in response to the output of the column decoder 92 for connecting the bit lines BLA2 and $\overline{\text{BLA2}}$ to the data input/output buses I/O and $\overline{\text{I/O}}$, respectively.

In the same manner, there are provided in association with the subarray B an equalize block 90b which is activated in response to the equalizing signal $\phi_{EQB}$ for equalizing the potential on each pair of bit lines, a group 91b of sense amplifiers which is activated in response to sense amplifier activating signals $\phi_{SBP}$ and $\phi_{SBN}$ for detecting and amplifying the potential difference between each pair of bit lines, and a column select gate block 93b responsive to the output of the column decoder 92 for connecting a pair of bit lines to the data input/output buses I/O and $\overline{\text{I/O}}$. In FIG. 4, only transfer gates Q5, Q6, Q7 and Q8 in the column select gate block 93b are illustrated. However, the group 91b of sense amplifiers, the equalize block 90b and the subarray B have the same structure as that of the group 91a of sense amplifiers, the equalize block 90b and the subarray A, respectively. In addition, in the same manner as the pair of bit lines BLA1 and $\overline{\text{BLA 1}}$, an equalizing transistor, a sense amplifier, and a column select gate transistor are provided for a pair of bit lines (not shown).

As can be seen from FIG. 4, a precharging transistor for precharging a bit line to $\frac{1}{2}$ Vcc ($= V_{BL}$) is not provided and therefore, the precharging voltage $V_{BL}$ is not generated, unlike a structure of the conventional DRAM shown in FIG. 2.

In the structure shown in FIG. 4, timing of generating the control signals $\phi_{SAP}$, $\phi_{SAN}$, $\phi_{SBP}$, $\phi_{SAN}$, $\phi_{EQB}$ and $\phi_{EQA}$ is different from that of the conventional DRAM.

Figure 5:
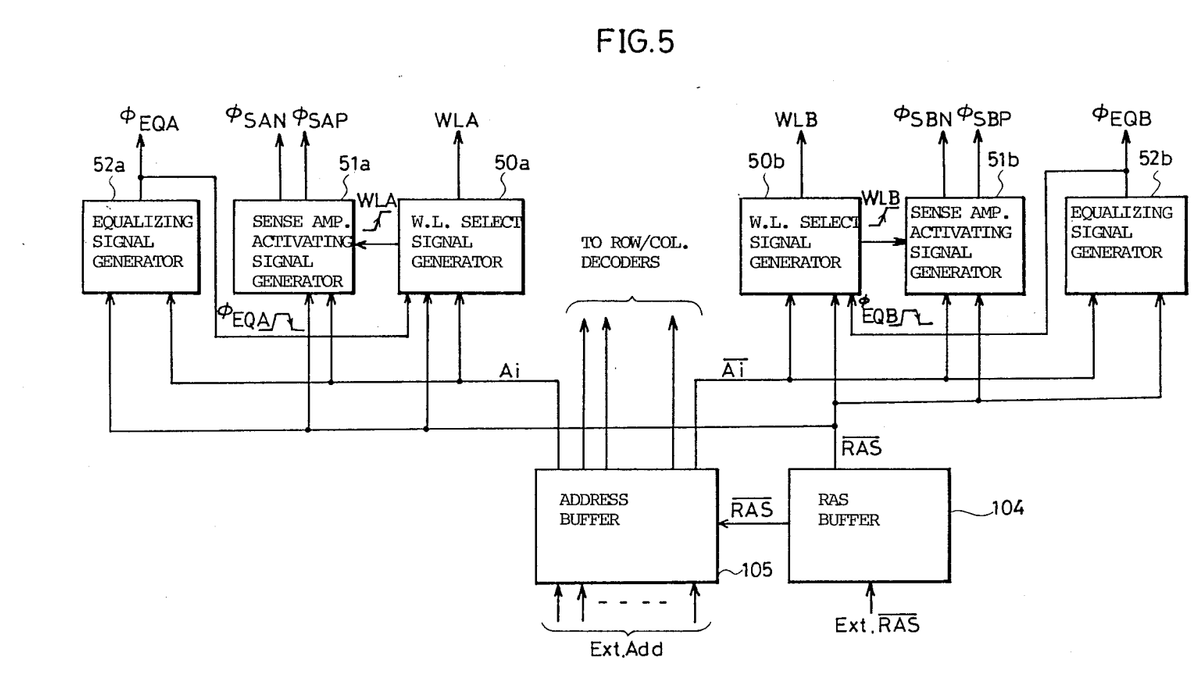
FIG. 5 is a block diagram showing a structure of a main control signal generator used in the DRAM according to an embodiment of the present invention.

FIG. 5 is a block diagram showing a structure of each control signal generator of the DRAM according to an embodiment of the present invention.

Referring now to FIG. 5, there are provided in association with the subarray A an equalizing signal generator 52a responsive to a block select address Ai from an address buffer 105 and an internal clock signal $\overline{\text{RAS}}$ from a RAS buffer 104 for generating an equalizing signal $\phi_{EQA}$, a word line select signal generator 50a responsive to the block select address Ai from the address buffer 105, the internal clock signal $\overline{\text{RAS}}$ from the RAS buffer 104 and the equalizing signal $\phi_{EQA}$ from the equalizing signal generator 52a for generating a word line select signal WLA, and a sense amplifier activating circuit 51a responsive to the internal clock signal $\overline{\text{RAS}}$ from the RAS buffer 104, the word line select signal WLA from the word line select signal generator 50a and the block select address Ai for generating the sense amplifier activating signals $\phi_{SAP}$ and $\phi_{SAN}$.

When the block select address Ai designates the subarray A, the equalizing signal generator 52a renders the equalizing signal $\phi_{EQA}$ active (i.e. and "H" level) in response to the fall of the internal clock signal $\overline{\text{RAS}}$ and applies the same to the equalize block 90a.

The signal WLA from the word line select signal generator 50a rises in response to the fall of the equalizing signal $\phi_{EQA}$ and falls in response to the rise of the internal clock signal $\overline{\text{RAS}}$. The signal WLA is transmitted to the selected word line WL in the subarray A through a row decoder (now shown).

The sense amplifier activating circuit 51a is activated in response to the block select address Ai for generating a sense amplifier activating signal $\phi_{SAN}$ which remains at an "H" level until a predetermined time period is elapsed from the fall of the $\overline{\text{RAS}}$ signal in response to the rise of the word line select signal WLA and a sense amplifier activating signal $\phi_{SAP}$ which remains at an "L" level until a predetermined time period is elapsed from the fall of the $\overline{\text{RAS}}$ signal in response to the rise of the word line select signal WLA. These activating signals $\phi_{SAN}$ and $\phi_{SAP}$ are applied to the group 91a of sense amplifiers. Thus, only if the subarray A is accessed, each sense amplifier in the group 91a of sense amplifiers is rendered inactive from the time when each pair of bit lines is equalized to the time when sensing operation of each pair of bit lines is started, and rendered active during the other time period.

In the same manner, there are provided in association with the subarray B a word line signal generator 50b for generating the word line select signal WLB, a sense amplifier activating circuit 51b for generating the sense amplifier activating signals $\phi_{SBP}$ and $\phi_{SBN}$, and an equalizing signal generator 52b for generating the equalizing signal $\phi_{EQB}$. Timing of generating each control signal is the same as timing of generating each control signal in corresponding circuits provided for the subarray A. More specifically, only when a block select address Ai from the address buffer 105 designates the subarray B, sense amplifiers in the subarray B are rendered inactive and the word line select signal WLB is transmitted to the selected word line. If and when the subarray B is not accessed, the equalizing signal $\phi_{EQB}$ remains at the "L" level, the sense amplifier activating signal $\phi_{SBN}$ remains at the "L" level, the activating signal $\phi_{SBP}$ remains at the "H" level and the select signal WLB remains at the "L" level. At that time, only sense amplifier activating signals $\phi_{SBN}$ and $\phi_{SBP}$ are activated.

Figure 6:
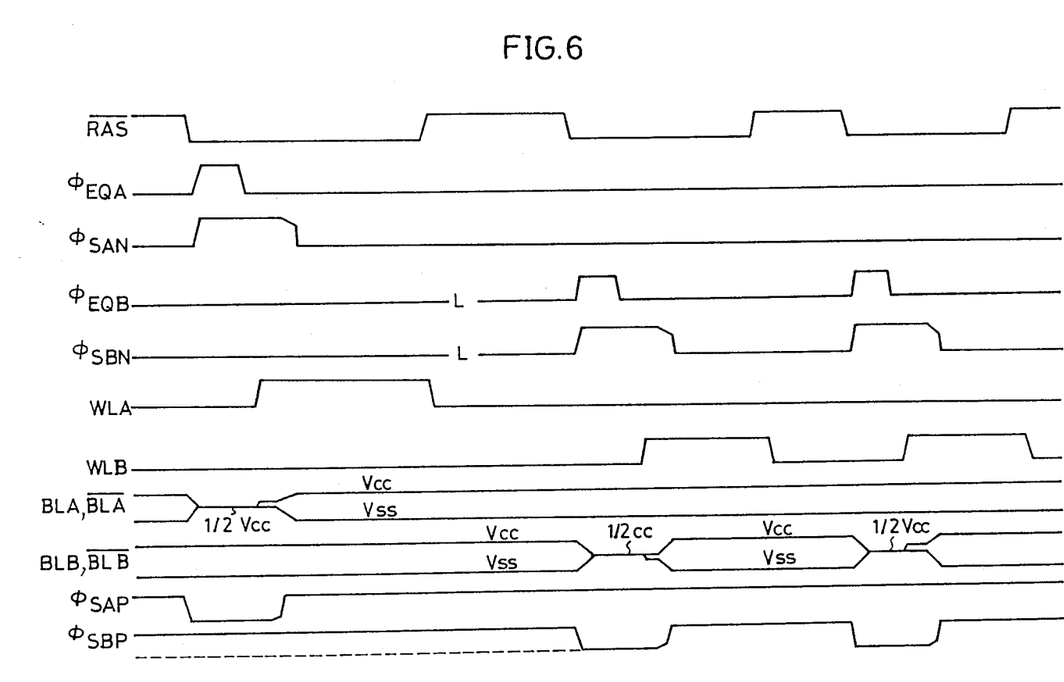
FIG. 6 is a waveform diagram showing operation of the DRAM of a partial activating system according to an embodiment of the present invention.

FIG. 6 is a waveform diagram showing operation at the time of sensing of the DRAM of a partial activating system according to an embodiment of the present invention.

Referring now to FIGS. 4 to 6, description is made on sensing operation of the DRAM according to an embodiment of the present invention.

Before a new operation cycle is started (the clock signal $\overline{RAS}$ is at the "H" level), the sense amplifier activating signals $\phi_{SAP}$ and $\phi_{SBP}$ are at the "H" level, the sense amplifier activating signals $\phi_{SAN}$ and $\phi_{SBN}$ are at the "L" level, and thus all the sense amplifiers in the groups 91a and 91b of sense amplifiers are activated. Thus, each bit line holds the potential (the power-supply potential Vcc or the ground potential Vss) detected and amplified during the previous operation cycle.

When the internal clock signal $\overline{RAS}$ falls in response to the fall of the external clock signal Ext. $\overline{RAS}$, a new operation cycle is started. The clock signal $\overline{RAS}$ provides timing of strobing the external address signal Ext. Add in the address buffer 105. The block select addresses Ai and $\overline{Ai}$ and the row address signal are generated from the address buffer 105. When the block select addresses Ai and $\overline{Ai}$ designate the subarray A, the equalizing circuit 52a is activated by the block select address Ai, so that the equalizing signal $\phi_{EQA}$ rises to the "H" level in response to the fall of the clock signal $\overline{RAS}$. At the same time, the sense amplifier activating signals $\phi_{SAP}$ and $\phi_{SAN}$ from the sense amplifier activating circuit 51a are rendered inactive, that is, the signal $\phi_{SAP}$ attains the "L" level and the signal $\phi_{SAN}$ attains the "H" level. Therefore, the pairs of bit lines BLA1 and $\overline{BLA1}$ and BLA2 and $\overline{BLA2}$ in the subarray A are electrically connected by the transfer gates 13a and 23a in the equalize block 90a, and the bit lines BLA1, $\overline{BLA1}$, BLA2 and $\overline{BLA2}$ in the pairs of bit lines are equalized to be an intermediate potential ½ Vcc level between the power-supply potential Vcc level and the ground potential Vss level.

On the other hand, since the block select address $\overline{Ai}$ does not designate the subarray B, the equalizing signal generator 52b is inactivated. In addition, both the sense amplifier activating signals $\phi_{SBP}$ and $\phi_{SBN}$ from the sense amplifier activating circuit 51b are activated. Each bit line in the subarray B holds the "H" (=Vcc) or "L" (=Vss) level detected and amplified during the previous operation cycle.

When the equalizing signal $\phi_{EQA}$ then falls, the word line selecting signal WLA which rises to the "H" level in response to the fall of RAS is generated from the word line select signal generator 50a. The word line select signal WLA is transmitted to a single word line designated by a row address through a row decoder. Therefore, the potential difference corresponding to information stored in memory cells connected to the selected word line appears on each pair of bit lines. When the word line selecting signal WLA rises, the sense amplifier activating signals $\phi_{SAN}$ and $\phi_{SAP}$ are rendered active, that is, the activating signal $\phi_{SAN}$ is changed to the "L" level and the activating signal $\phi_{SAP}$ is changed to the "H" level after a lapse of a predetermined time period from the rise of WLA. Each sense amplifier of the group 91a is activated again, so that the potential difference between each pair of bit lines in the subarray A is sensed and amplified. Thereafter, a pair of bit lines in the subarray A is selected in response to the decoded column address signal from the column decoder 92, so that information stored in the selected pair of bit lines are read out through the column select gate 93a and the data input/output buses I/O and $\overline{I/O}$. At the same time, the amplified signal voltage in each pair of bit lines is rewritten into the original memory cell. Then, the word line select signal WLA falls and the potential on the selected word line falls in response to the rise of the internal clock signal $\overline{RAS}$. Thus, one operation cycle is completed. At that time, in both the subarrays A and B, all the sense amplifier activating signals $\phi_{SAP}$, $\phi_{SAN}$, $\phi_{SBN}$ and $\phi_{SBP}$ are activated and all the bit lines in the memory cell array are at the either "H" or "L" level.

When access is made to the memory cell in the subarray B, each pair of bit lines in the subarray B is equalized, each sense amplifier in the group 91b of sense amplifiers is inactivated, the potential on the selected word line rises, the potential difference between each pair of bit lines is detected and amplified, and the amplified signal voltage is rewritten into the respective original memory cells in response to the block select address $\overline{Ai}$ from the address buffer 105 at the same timing as that at the time of accessing the above described subarray A.

Although in the above described embodiment, operation for partially activating a memory cell array which is divided into the subarrays A and B is described by way of an example, the memory cell array may be divided into a plurality of subarrays such as four or eight subarrays, in which case the same effect as the above described embodiment can be obtained.

As described in the foregoing, since a pair of bit lines is equalized at the beginning of an active cycle (immediately before the rise of the potential on a word line) only with respect to a subarray having a word line (or a memory cell) to be selected, and the potential detected and amplified during the previous cycle is held in each bit line even in the active (operation) cycle with respect to a subarray having no selected word line, the intermediate potential on the bit line serving as a reference potential to information stored in the memory cell can be precisely set and a constant voltage circuit for equalizing/precharging the bit line is not required, so that the circuit structure is simplified and precise sensing operation of information of the memory cell can be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory comprising a memory cell array having a plurality of memory cells each arranged in a matrix of rows and colums for storing information, a plurality of word lines each connecting memory cells aligned in said column direction to each other, a plurality of pairs of bit lines connected to the memory cells aligned in said row direction and having a folded bit line structure, a plurality of sense amplifiers connected to respectively the pairs of bit lines for detecting and amplifying the potential difference between the pair of bit lines, and equalizing means coupled to each of said pairs of bit lines for equalizing potentials on the pairs of bit lines, said memory cell array being divided into a plurality of subarrays, comprising:

- word line selecting signal generating means for generating a signal for selecting a single word line from said plurality of word lines,
- first activating means, responsive to address signals, for activating the equalizing means included only in a subarray having a word line to be selected during a predetermined first period to enable said bit line pairs to become charged to a predetermined potential,
- first inactivating means, responsive to said word line selecting signal, for inactivating the sense amplifiers included only in the subarray having said selected word line during a predetermined second period,
- second activating means, responsive to said word line selecting signal, for activating said selected word line and reading out information stored in memory cells connected to the word line to the bit lines connected to the memory cells after the sense amplifiers are rendered inactive by said inactivating means, and
- third activating means, responsive to said word line selecting signal, for activating the sense amplifiers and holding a state detected by the sense amplifiers after information stored in the memory cells are read out on the bit lines by said second activating means.

2. A dynamic random access memory in accordance with claim 1, wherein said word line selecting signal generating means includes means for generating said word line selecting signal after said predetermined first period is terminated.

3. A dynamic random access memory in accordance with claim 1, wherein said first activating means includes means responsive to a memory access request signal and a memory cell address signal for generating an equalizing means control signal for enabling said equalizing means included only in the subarray having a word line to be selected.

4. A dynamic random access memory in accordance with claim 1, wherein said first activating means includes means responsive to a memory access request signal and a memory cell address signal for inactivating the sense amplifiers included only in the subarray having said selected word line.

5. A dynamic random access memory in accordance with claim 1, wherein said second activating means includes means responsive to said equalizing means for reading out said stored information.

6. A dynamic random access memory in accordance with claim 1, wherein said third activating means includes means for activating said sense amplifiers responsive to said word line selecting signal generating means.

7. In a dynamic random access memory comprising a memory cell array having a plurality of memory cells each arranged in a matrix of rows and columns for storing information, a plurality of word lines each connecting memory cells aligned in said column direction to each other, a plurality of pairs of bit lines connected to the memory cells aligned in said row direction and having a folded bit line structure, a plurality of sense amplifiers connected to respectively the pairs of bit lines for detecting and amplifying the potential difference between the pairs of bit lines, and equalizing means coupled to each of said pairs of bit lines for equalizing potentials on the pairs of bit lines, said memory cell array being divided into a plurality of subarrays, a method of accessing selectively memory cells and charging said bit line pairs to a predetermined potential, comprising the steps of:

- generating a signal ($\phi_{EQA}$, $\phi_{EQB}$), in response to address signals, during a predetermined first period for equalizing bit line pairs only in a subarray having a word line to be selected, the bit line pairs in the remaining subarrays being charged to a predetermined potential by said sense amplifiers,
- inactivating, during a predetermined second period, the sense amplifiers included only in the subarray having said selected word line in response to said word line selecting signal,
- activating, after the sense amplifiers are activated, said selected word line and reading out the information in the memory cells which are connected to the selected word line to the bit lines connected to the memory cells in response to said word line selecting signal, and
- activating the sense amplifiers (91a, 91b) and holding a state detected by the sense amplifiers after information stored in the memory cells are read out.

8. A method in accordance with claim 7, wherein said predetermined first period is terminated before the selected word line is activated.

9. A method in accordance with claim 7, including the step of generating memory access request (Ext. $\overline{RAS}$) and memory cell address signals (Ext. Add), wherein the step of equalizing is carried out in response to said memory access request and memory cell address signals.

10. A method in accordance with claim 9, wherein said step of equalizing further includes the steps of
- reading said memory cell address signal, and
- in accordance with said memory cell address signal, determining the subarray having a word line to be selected.

11. A method in accordance with claim 7, including the step of generating memory access request and memory cell address signals, and wherein said step of inactivating the sense amplifiers is carried out in response to said memory access request and memory cell address signals.

12. A method in accordance with claim 11, wherein the step of inactivating the sense amplifiers further includes the steps of
- reading memory cell address signal, and
- in accordance with the memory cell address signal inactivating the sense amplifiers (91a, 91b) included only in the subarray having the selected word line.

13. A method in accordance with claim 7, wherein the step of activating said selected word line and reading out stored information is carried in response to equalizing the bit line pairs.

14. A method in accordance with claim 7, wherein the step of activating the sense amplifiers is carried out in response to selecting the word line.

15. A dynamic random access memory comprising:

a memory cell array having a plurality of memory cells for storing information and arranged in a matrix of rows and columns, said memory cell array being divided into a plurality of subarrays:

a plurality of word lines each connecting memory cells aligned in a row direction to each other;

a plurality of pairs of bit lines connected to memory cells aligned in a column direction;

word line selecting signal generating means for generating a signal for selecting a single word line from said plurality of said word lines;

equalizing means coupled to each of said pairs of bit lines for equalizing potentials on respective said pairs of bit lines, a portion of said equalizing means included only in a subarray having a word line to be selected being activated for a predetermined time interval and being inactivated for a time interval excluding said predetermined time interval, the remainder of said equalizing means being kept at the inactivated state for a time interval including said predetermined time interval; and a plurality of sense amplifiers each connected to a corresponding pair of bit lines for detecting and amplifying a potential difference between said corresponding pair of bit lines, a portion of said plurality of sense amplifiers included only in a subarray corresponding to a selected word line being adapted to be inactivated for a predetermined time duration after the equalizing means included in the same subarray have been inactivated and said sense amplifiers in said same subarray being adapted to be set in the activated state for a time duration excluding said predetermined time duration, the remainder of said plurality of sense amplifiers included in said subarray having said selected word line being kept in an activated state over a time duration including said predetermined time duration.

* * * * *